(12) United States Patent
Westra et al.

(10) Patent No.: US 7,551,035 B2
(45) Date of Patent: Jun. 23, 2009

(54) FAST CONVERTER FOR CROSSING VOLTAGE DOMAINS

(75) Inventors: Jan Roelof Westra, Uithoorn (NL); Franciscus Maria Leonardus van der Goes, The Hague (NL); Erol Arslan, Beveren (NL)

(73) Assignee: Broadcom Corporation, Irvine, CA (US)

( * ) Notice: Subject to any disclaimer, the term of this patent is extended or adjusted under 35 U.S.C. 154(b) by 107 days.

(21) Appl. No.: 11/508,966

(22) Filed: Aug. 24, 2006

(65) Prior Publication Data

US 2007/0182605 A1 Aug. 9, 2007

Related U.S. Application Data

(60) Provisional application No. 60/771,010, filed on Feb. 8, 2006.

(51) Int. Cl.
*H03F 3/04* (2006.01)
(52) U.S. Cl. .................. 330/311; 330/277; 330/302
(58) Field of Classification Search .............. 330/311, 330/277, 302
See application file for complete search history.

(56) References Cited

U.S. PATENT DOCUMENTS

| 5,815,012 | A | * | 9/1998 | Rivoir et al. | 327/103 |
| 6,869,216 | B1 | * | 3/2005 | Holloway et al. | 374/170 |
| 6,914,476 | B2 | * | 7/2005 | Ingino, Jr. | 327/540 |
| 7,279,925 | B1 | * | 10/2007 | Richmond et al. | 326/27 |
| 7,282,954 | B2 | * | 10/2007 | Quinn | 326/81 |
| 7,295,071 | B1 | * | 11/2007 | Lee | 330/258 |

* cited by examiner

*Primary Examiner*—Patricia Nguyen
(74) *Attorney, Agent, or Firm*—Sterne, Kessler, Goldstein & Fox, P.L.L.C.

(57) ABSTRACT

A voltage domain crossing circuit and method are disclosed. In one embodiment, the voltage domain crossing circuit comprises an AC coupling component, a DC biasing component and a high voltage output amplifier. The AC coupling component receives an input low voltage signal and AC couples and splits the signal into two voltages. The two voltages are then DC biased to a predetermined bias voltage using the DC biasing component. The high voltage output amplifier then amplifies the biased voltages in the high voltage domain yielding a signal in the high voltage domain. Other embodiments of the voltage domain crossing circuit and method are also disclosed.

24 Claims, 8 Drawing Sheets

FAST CONVERTER FOR CROSSING VOLTAGE DOMAINS

CROSS REFERENCE TO RELATED APPLICATIONS

This application claims benefit to U.S. Provisional Patent Application No. 60/771,010, filed Feb. 8, 2006, entitled "A Fast Converter for Crossing Voltage Domains", which is incorporated by reference in its entirety.

BACKGROUND OF THE INVENTION

1. Field of the Invention

The present invention relates generally to systems for crossing voltage domains, and more specifically, to a fast converter for crossing voltage domains.

2. Background Art

In many electronic systems, multiple voltage supply domains are used. In general, digital electronic signals on an integrated circuit are transported using the lowest possible voltage, given the fabrication technology of the circuit. However, representations of the same signals are sometimes necessary in voltage domains of a higher supply voltage. In general, higher voltages are used in analog or mixed-signal circuits, or circuits interfacing signals to external circuits.

Referring now to FIG. 1, there is shown a block diagram illustrating the general problem of crossing voltage domains. In FIG. 1(a) a crossing from the high-voltage domain to the low-voltage domain is depicted. The actual signal crossing the domain boundaries is a voltage represented in the high-voltage domain. The problem is here to make the input of the circuit in the low-voltage domain in such a way that it can handle the signal represented in the high-voltage domain without being damaged.

In FIG. 1(b) a crossing from the low-voltage domain to the high-voltage domain is depicted. The actual signal crossing the domain boundaries here is represented in the low-voltage domain. Therefore, in general, the level of the signals from the low-voltage domain is not adequate to be received by the circuits in the high-voltage domain.

A generally known method used for crossing voltage domain boundaries is by first transforming the voltage domain signals to the current domain and then crossing the voltage domain boundary in the current domain. Referring now to FIG. 2, there is shown a circuit which illustrates this method for a high-voltage to low-voltage domain crossing in the current domain. In FIG. 2, the high-voltage devices are denoted by the thicker gates and the low-voltage devices are illustrated with the thinner gates. As is illustrated in FIG. 2, first the input signal is inverted, to enable the availability of both polarities of the signal. After inversion of the signal, two high-voltage NMOS devices transfer the signal to the current domain. The current is injected into a PMOS latch in the low-voltage domain. In this circuit, the high-voltage NMOS devices are only able to pull down the nodes of the latch, while the latch itself can only pull up its two nodes.

Referring now to FIG. 3, there is shown a prior art circuit for a low-voltage to high-voltage domain boundary crossing. The circuit in FIG. 3 is similar to the circuit 200 in FIG. 2 when high and low-voltage devices are swapped. However, the two pull-down NMOS devices still remain high-voltage devices. At the gates of these two high-voltage devices however, a signal coming from the low-voltage domain is used which will make the response of these devices very slow. In many circuits, the inherent low speed capabilities of this circuit are a problem.

Therefore, what is needed is a circuit for crossing voltage domains without the problems in the prior art.

BRIEF SUMMARY OF THE INVENTION

The present invention comprises a system and method, such as a voltage domain crossing circuit, substantially as shown in and/or described in connection with at least one of the figures, as set forth more completely in the claims.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

DETAILED DESCRIPTION OF THE INVENTION

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known processes and steps have not been described in detail in order not to unnecessarily obscure the present invention.

The present invention generally pertains to a fast converter for crossing voltage domains. In the embodiments described below, the circuit of the present invention overcomes the speed limitations of the prior art low-voltage to high-voltage domain crossing circuits.

Figure 1:
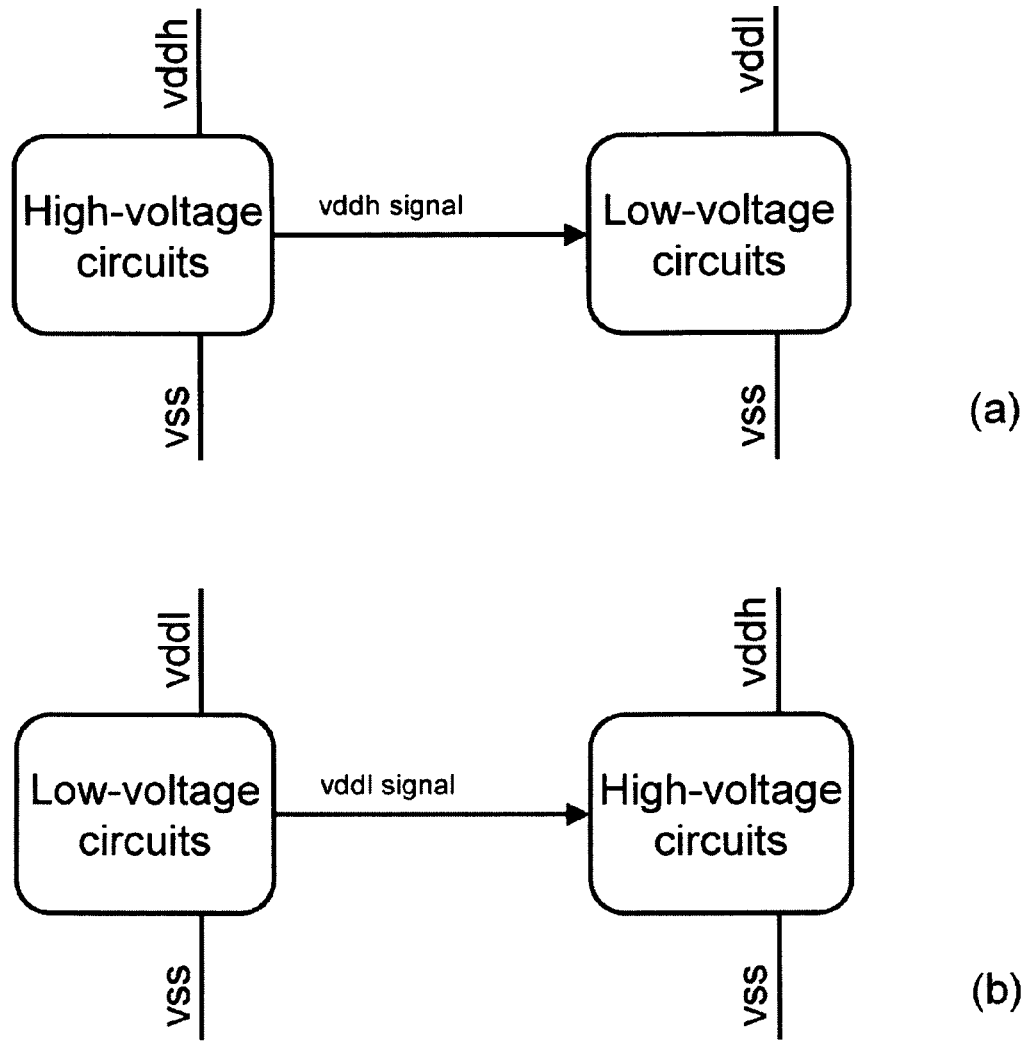
FIG. 1 is a high level diagram illustrating the problem of crossing voltage domains.
Figure 2:
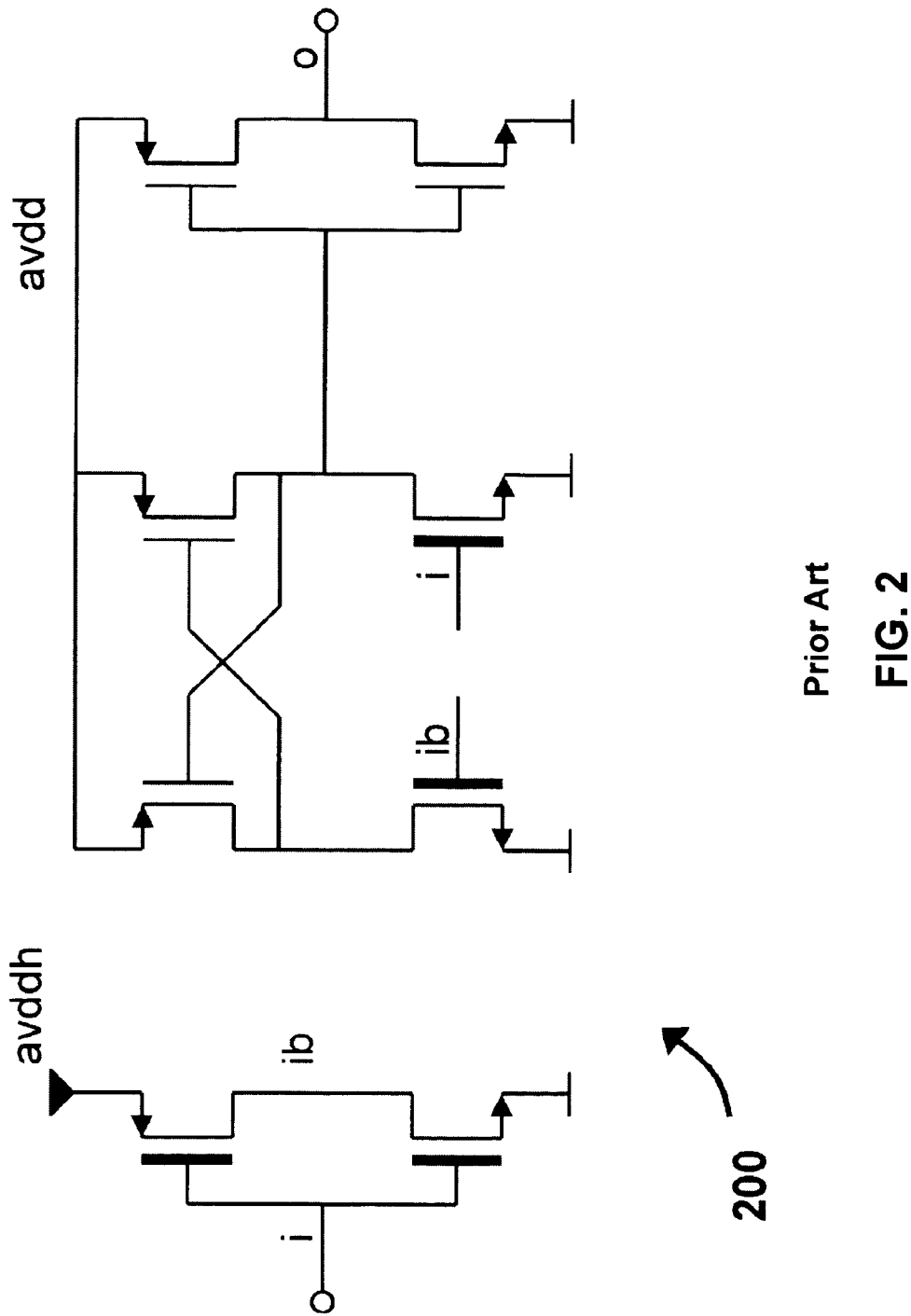
FIG. 2 illustrates a prior art circuit for enabling boundary crossing from high to low voltage domains.
Figure 3:
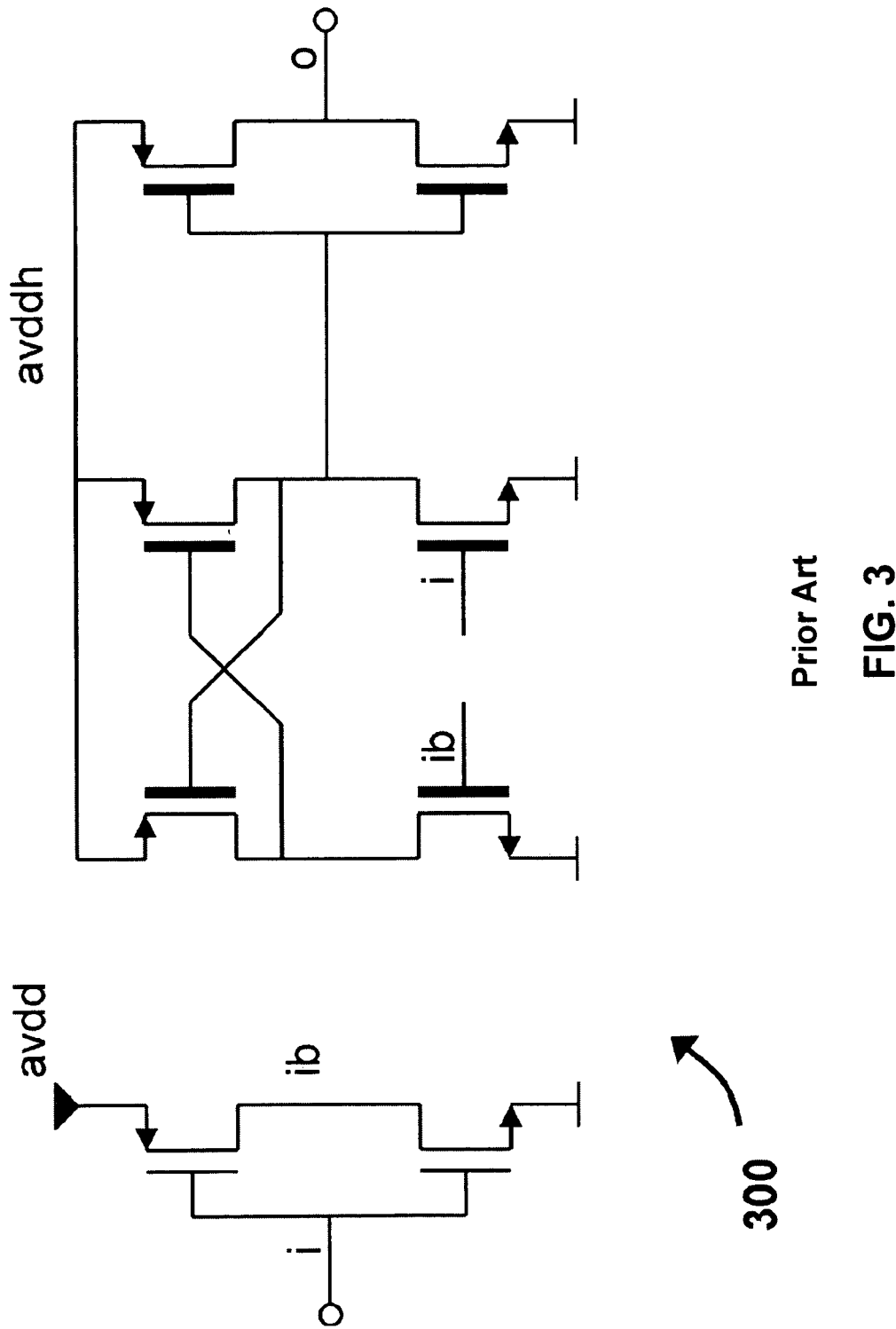
FIG. 3 illustrates a prior art circuit for enabling boundary crossing from low to high voltage domains.
Figure 4:
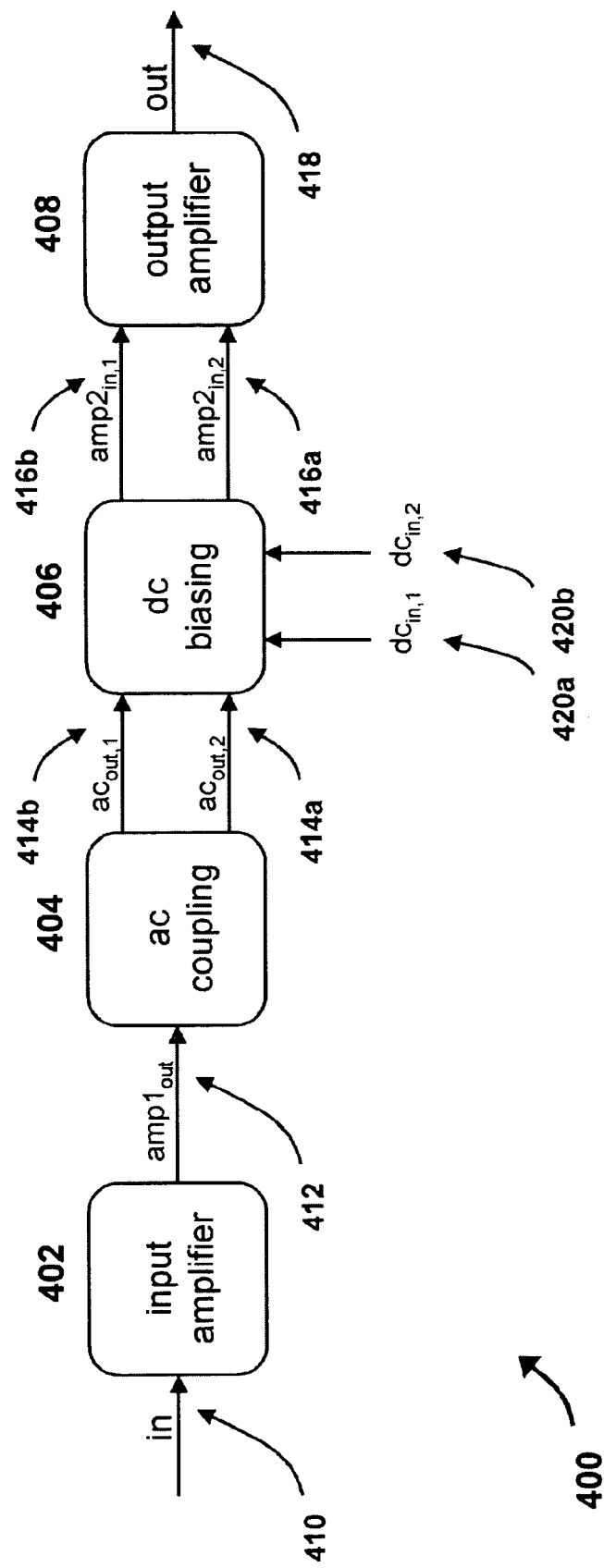
FIG. 4 illustrates a high-level schematic of a voltage domain crossing circuit in accordance with one embodiment of the present invention.

Referring now to FIG. 4, there is shown a high-level schematic of a voltage domain crossing circuit in accordance with one embodiment of the present invention. In the voltage domain crossing circuit 400, the input low-voltage signal 410 is amplified by input amplifier 402. The output signal 412 of input amplifier is AC coupled and split by AC coupling circuit 404, into two voltages 414a and 414b, which are DC biased by DC voltages 420a and 420b. Resulting output signals 416a and 416b can then be amplified by output amplifier 408 in the high-voltage domain, yielding output signal 418 in the high-voltage domain. When the circuit driving the input low-voltage signal 410 is powerful enough to drive AC coupling circuit 404 directly, input amplifier 402 can be removed from the signal path.

In this method for crossing voltage domains, the signals crossing the actual voltage domain borders are not signals in the current domain, but AC coupled voltages 414a and 414b at biased DC levels to make them suitable to be received by output amplifier 408.

Figure 5:
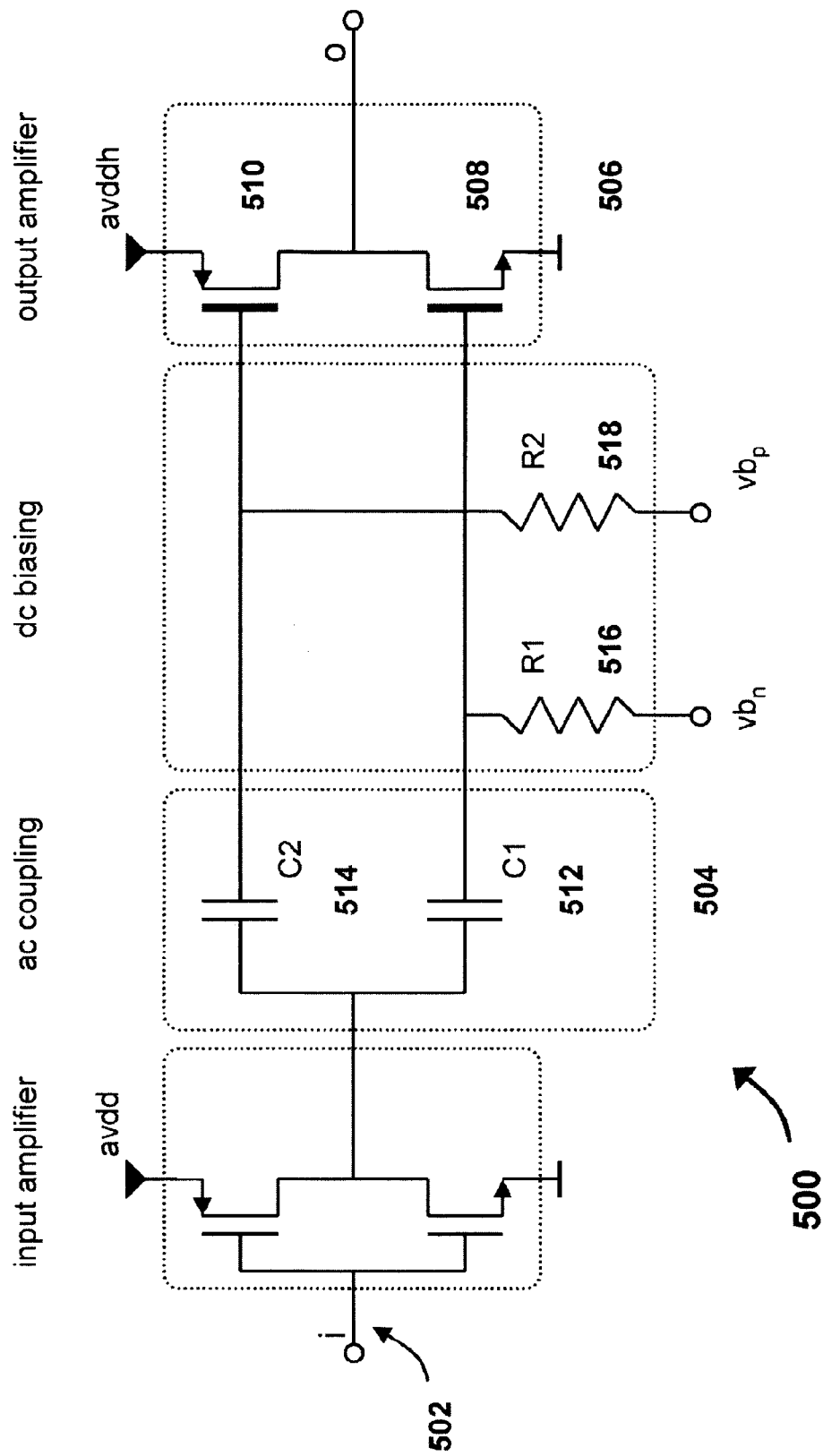
FIG. 5 illustrates a voltage domain crossing circuit in accordance with one embodiment of the present invention.

Referring now to FIG. 5, there is shown a voltage domain crossing circuit 500 in accordance with one embodiment of the present invention. In the voltage domain crossing circuit 500, the input low-voltage signal 502 is AC coupled by AC coupling circuit 504 to the gates of the output, high-voltage inverter 506. Both NMOS 508 and PMOS 510 high-voltage transistors are driven. The two couple capacitors, 512, 514, are precharged to a voltage such that the input low-voltage AC signal will open and close both transistors, 508, 510 of the output amplifier 506. Although the transistors, 508, 510, in the output amplifier are shown as thick oxide transistors in FIG. 5, one skilled in the art will realize that these transistors 508, 510 are not limited to high voltage devices but that depending on the process used to manufacture the transistors, low voltage devices may also be used with the output amplifier. In one embodiment, this is done by charging the capacitors with a high-ohmic resistor, 516, 518 to the desired value as depicted in FIG. 5.

Figure 6:
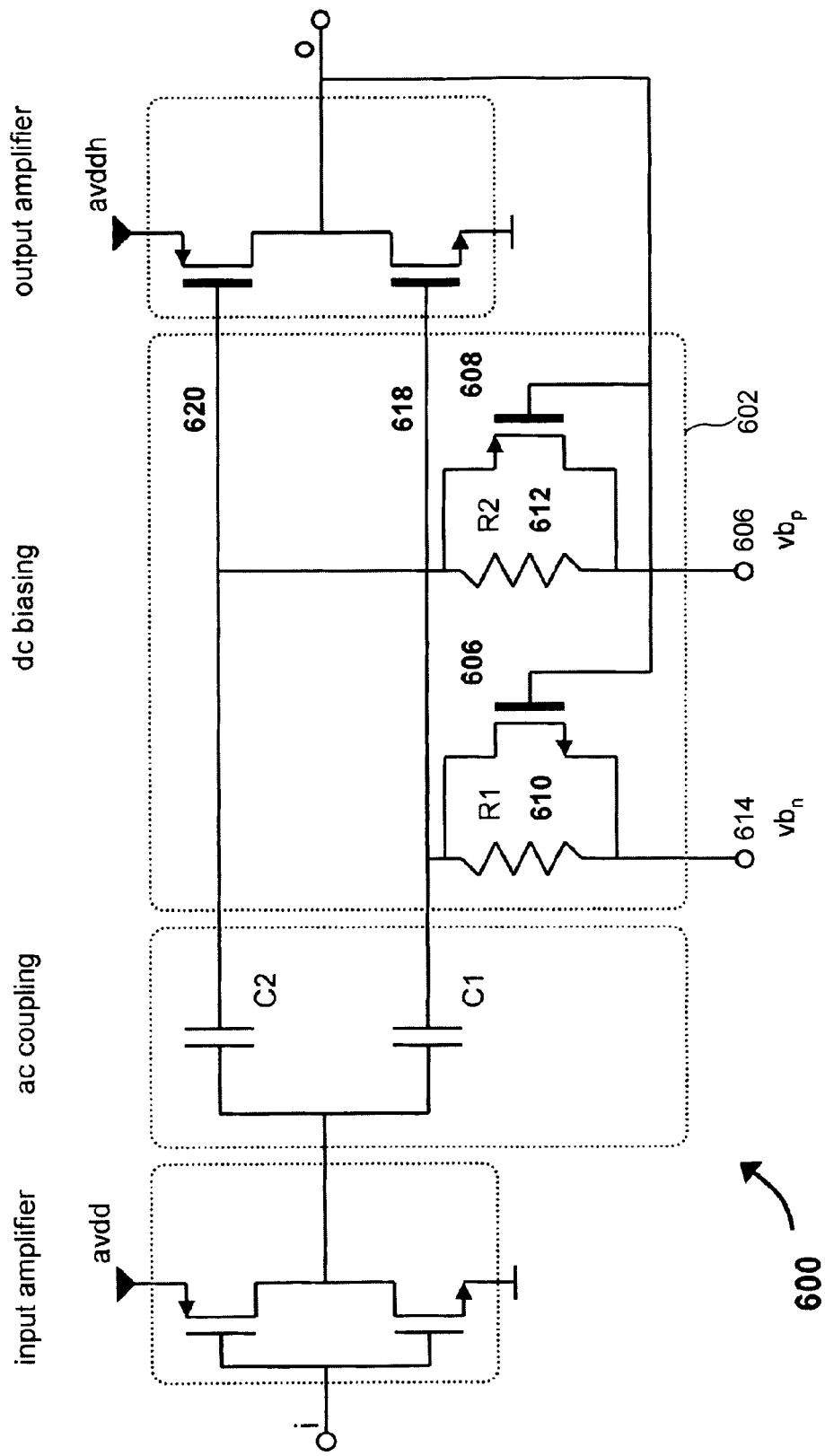
FIG. 6 illustrates a voltage domain crossing circuit with an improved bias circuit in accordance with another embodiment of the present invention.

Referring now to FIG. 6, there is shown another voltage domain crossing circuit 600 in accordance with another embodiment of the present invention. The voltage domain crossing circuit 600 further comprises an improved bias circuit 602. The improved bias circuit demonstrates an even more elegant way of achieving biasing of the two inverter gates. In the voltage domain crossing circuit 600, two transistors, 606, 608, are connected across the two bias resistors, 610, 612. These two transistors, 606, 608, are connected as switches between the node carrying the desired bias voltage, 614, 616, and the input gates, 618, 620, of the output inverter.

The use of transistors in the voltage domain crossing circuit 600 has at least two advantages over the voltage domain crossing circuit 500 which uses only resistors: First, the biasing of the circuit depicted in voltage domain crossing circuit 600 is faster than the biasing of the voltage domain crossing circuit 500 because the switches can be more low-ohmic than the resistor, as they only switch on at the moment the bias voltage can be connected to the gate of the output transistor (that is, when the corresponding output transistor is off). Second, the value of the bias resistors, 610, 612, can now be much higher, which reduces the resulting drop of the charge biasing the two capacitors. The resistors are still present in the circuit to ensure startup of the circuit.

Figure 7:
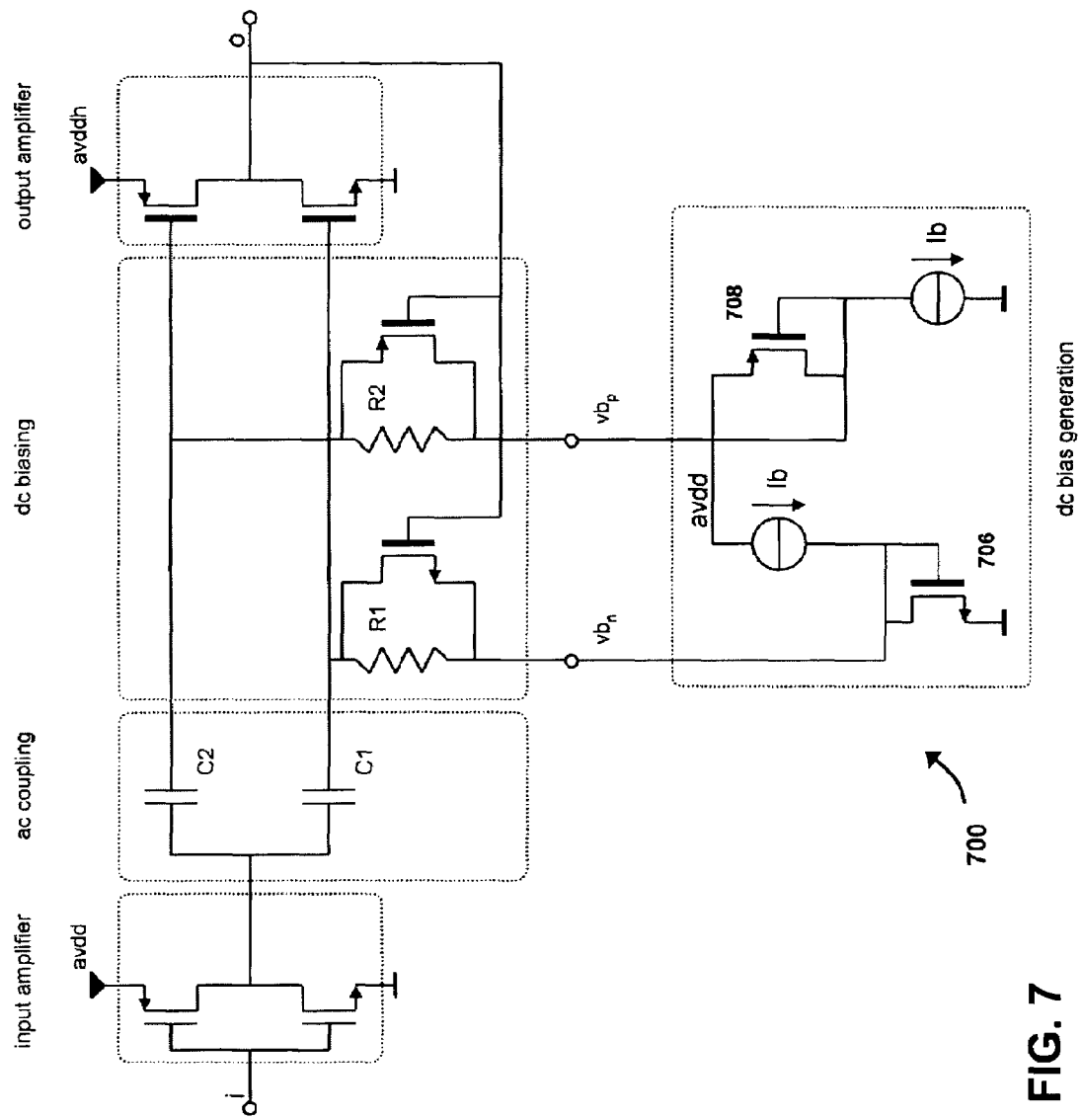
FIG. 7 illustrates a voltage domain crossing circuit in accordance with a preferred embodiment of the present invention.

Referring now to FIG. 7, there is shown another voltage domain crossing circuit 700 in accordance with yet another preferred embodiment of the present invention. In voltage domain crossing circuit 700, the two desired bias voltages are generated by diode connected transistors, 706, 708, as shown in FIG. 7. When the diode connected transistor has the same size as the output transistor (or is a carefully scaled version of the output transistor), the bias voltage of the diode is copied onto the gate of the output transistor in its 'off' state. Thus, when the diode connected transistor carries a small bias current Ib, the output inverter transistors carry a current equal to that small bias current Ib in their off state, thus ensuring that both transistors will turn on when excited by the low-voltage input signal.

A necessary condition of this circuit in order to operate correctly is that the input signal has enough transitions to bias the output transistors correctly. Because both transistors are switched between a state that is just considered 'off' and is excited from that state by the low-voltage signal, the circuit is extremely fast and operates down to very low values of the input voltage amplitude.

Figure 8:
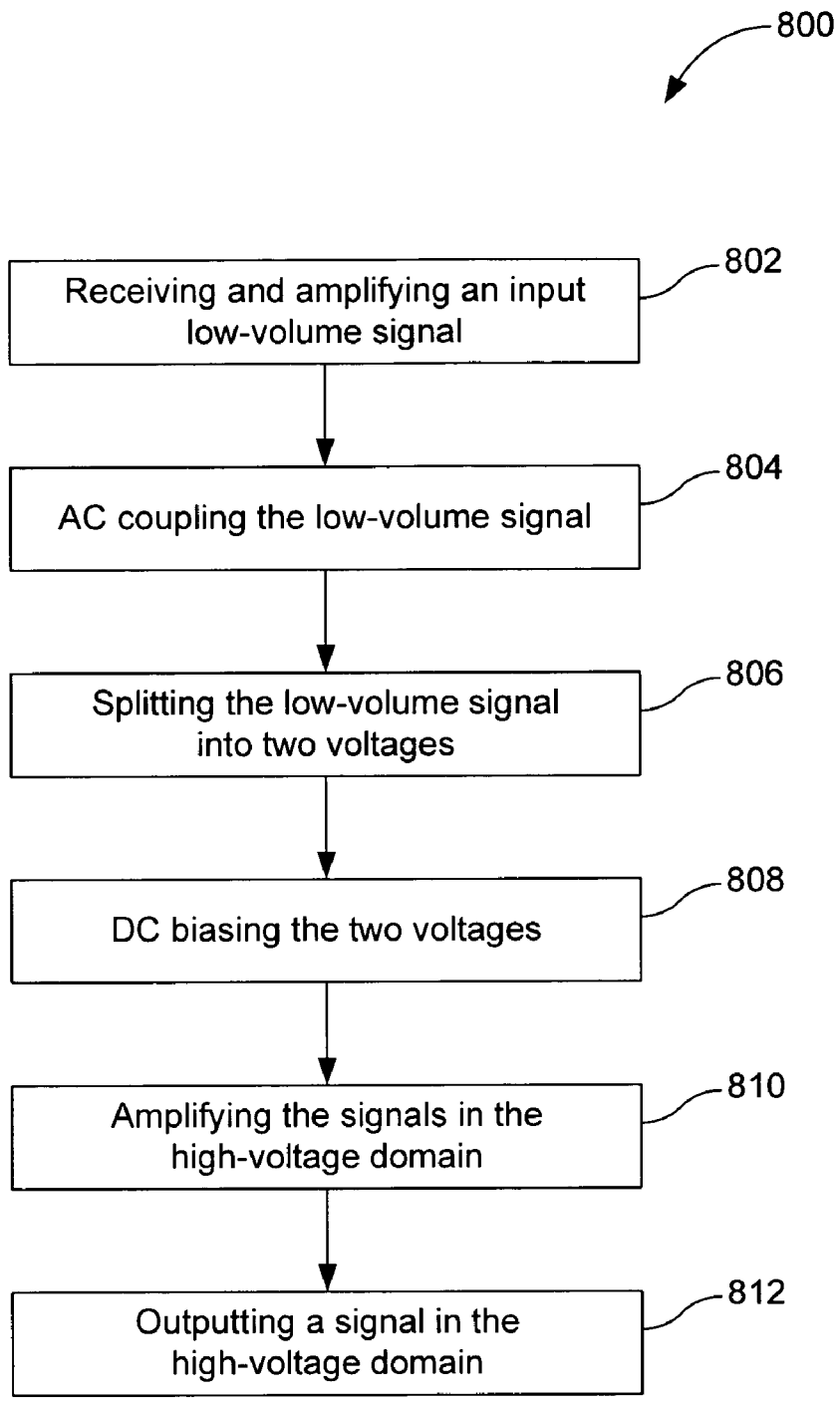
FIG. 8 is a block diagram of the steps of a method for voltage domain crossing in accordance with one embodiment of the present invention.

Referring now to FIG. 8, there is shown a block diagram 800 of the steps of a method for voltage domain crossing in accordance with one embodiment of the present invention. In step 802, an input low-voltage signal is received and amplified. This may be accomplished using an input amplifier. Alternatively, if the circuit driving the input low-voltage signal is powerful enough to drive the AC coupling circuit directly, then this step may be unnecessary. The low-voltage signal is then AC coupled in step 804 and split in step 806 into two voltages. Steps 804 and 806 may be accomplished using an AC coupling circuit comprising two capacitors which may be precharged to a predetermined voltage. The two voltages are then DC biased in step 808 and amplified in the high voltage domain in step 810 yielding an output signal in the high voltage domain. Step 808 may be accomplished using a DC biasing circuit comprising two bias resisters. Step 810 may be accomplished using an output amplifier comprising two gates, each of which are coupled to the capacitors of the AC coupling circuit.

In another embodiment, the DC biasing circuit may comprise two bias resistors and two transistors coupled across the two bias resistors for acting as switches between the nodes carrying the desired bias voltages and the input gates of the output amplifier. In yet another embodiment, the two desired bias voltages may be generated by a DC bias generation circuit. The DC bias generation circuit may comprise diode connected transistors coupled to the two desired bias voltages.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. A voltage domain crossing circuit, configured to provide an output signal in a high voltage domain based on an input signal from a low voltage domain, the low voltage domain having a lesser maximum operating voltage than the high voltage domain, comprising:

an AC coupling component configured to split the input signal from the low voltage domain into a first voltage signal and a second voltage signal;

a DC biasing component, coupled to the AC coupling component, configured to bias the first voltage signal with a first DC voltage to provide a first DC biased voltage signal and to bias the second voltage signal with a second DC voltage to provide a second DC biased voltage signal; and a high voltage output amplifier, coupled to the DC biasing component, configured to amplify the first DC biased voltage signal and the second DC biased voltage signal in the high voltage domain to provide the output signal in the high voltage domain.

2. The circuit of claim 1, further comprising:

a low voltage input amplifier, coupled to the AC coupling component, configured to amplify the input signal in the low voltage domain.

3. The circuit of claim 1, wherein the AC coupling component comprises:
a first capacitor; and
a second capacitor.

4. The circuit of claim 3, wherein the DC biasing component comprises:
a first resistor coupled to the first capacitor; and
a second resistor coupled to the second capacitor.

5. The circuit of claim 3, wherein the high voltage output amplifier comprises:
a first transistor coupled to the first capacitor; and
a second transistor coupled to the second capacitor.

6. The circuit of claim 3, wherein at least one of the first capacitor and the second capacitor are pre-charged to a predetermined voltage using one or more high-ohmic resistors.

7. A voltage domain crossing circuit, comprising:
an AC coupling component configured to split an input signal into a first voltage signal and a second voltage signal;
a DC biasing component configured to bias the first voltage signal with a first DC voltage to provide a first DC biased voltage signal and to bias the second voltage signal with a second DC voltage to provide a second DC biased voltage signal, the DC biasing component including:
a first capacitor,
a second capacitor, at least one of the first capacitor and the second capacitor being pre-charged to a predetermined voltage using one or more high-ohmic resistors,
a first transistor coupled across the first resistor, and
a second transistor coupled across the second resistor; and
a high voltage output amplifier, coupled to the DC biasing component, configured to amplify the first DC biased voltage signal and the second DC biased voltage signal in a high voltage domain to provide an output signal in the high voltage domain.

8. The circuit of claim 1, further comprising:
a DC bias generation circuit.

9. A voltage domain crossing circuit, configured to provide an output signal in a high voltage domain based on an input signal from a low voltage domain, the low voltage domain having a lesser maximum operating voltage than the high voltage domain, comprising:
an AC coupling component, having a first capacitor and a second capacitor, configured to split the input signal from the low voltage domain into a first voltage signal and a second voltage signal;
a DC biasing component, having a first resistor coupled to the first capacitor and a second resistor coupled to the second capacitor, configured to bias the first voltage signal with a first DC voltage to provide a first DC biased voltage and the second voltage signal with a second DC voltage to provide a second DC biased voltage; and
a high voltage output amplifier, coupled to the DC biasing component, configured to amplify the first DC biased voltage signal and the second DC biased voltage signal in the high voltage domain to provide the output signal in the high voltage domain.

10. The circuit of claim 9, further comprising:
a low voltage input amplifier, coupled to the AC coupling component, configured to amplify the input signal in the low voltage domain.

11. The circuit of claim 9, wherein the high voltage output amplifier comprises:
a first transistor coupled to the first capacitor; and
a second transistor coupled to the second capacitor.

12. The circuit of claim 9, wherein at least one of the first capacitor and the second capacitor are pre-charged to a predetermined voltage using one or more high-ohmic resistors.

13. A voltage domain crossing circuit, comprising:
an AC coupling component, having a first capacitor and a second capacitor, configured to split an input signal from a low voltage domain into a first voltage signal and a second voltage signal;
a DC biasing component, having a first resistor coupled to the first capacitor and a second resistor coupled to the second capacitor, configured to bias the first voltage signal with a first DC voltage to provide a first DC biased voltage signal and the second voltage signal with a second DC voltage to provide a second DC biased voltage signal, the DC biasing component including:
a first transistor coupled across the first resistor; and
a second transistor coupled across the second resistor; and
a high voltage output amplifier, coupled to the DC biasing component, configured to amplify the first DC biased voltage signal and the second DC biased voltage signal in a high voltage domain to provide an output signal in the high voltage domain.

14. The circuit of claim 13, wherein the first transistor and the second transistor each comprise:
a diode connected transistor.

15. A voltage domain crossing circuit, comprising:
an AC coupling component configured to split an input signal from a low voltage domain into a first voltage signal and a second voltage signal;
a DC biasing component, coupled to the AC coupling component, configured to bias the first voltage signal and the second voltage signal using a predetermined bias voltage;
a DC bias generation component, coupled to the DC biasing component, configured to generate the predetermined bias voltage; and
a high voltage output amplifier, coupled to the DC biasing component, configured to amplify the first DC biased voltage signal and the second DC biased voltage signal in a high voltage domain, the high voltage domain having a greater maximum operating voltage than the low voltage domain, to provide an output signal in the high voltage domain.

16. The circuit of claim 15, further comprising:
a low voltage input amplifier, coupled to the AC coupling component, configured to amplify the input signal in the low voltage domain.

17. The circuit of claim 15, wherein the AC coupling component comprises:
a first capacitor and a second capacitor.

18. The circuit of claim 17, wherein the DC biasing component comprises:
a first resistor coupled to the first capacitor; and
a second resistor coupled to the second.

19. The circuit of claim 17, wherein the high voltage output amplifier comprises:
a first transistor coupled to the first capacitor; and
a second transistor coupled to the second capacitor.

20. The circuit of claim 17, wherein at least one of the first capacitor and the second capacitor are pre-charged to a predetermined voltage using one or more high-ohmic resistors.

21. A voltage domain crossing circuit, comprising:
an AC coupling component, including a first capacitor and a second capacitor, configured to split an input signal into a first voltage signal and a second voltage signal;
a DC biasing component, coupled to the AC coupling component, configured to bias the first voltage signal and the second voltage signal using a predetermined bias voltage, the DC biasing component including:
a first resistor coupled to the first capacitor,
a second resistor coupled to the second,
a first transistor coupled across the first resistor, and
a second transistor coupled across the second resistor;
a DC bias generation component, coupled to the DC biasing component, configured to generate the predetermined bias voltage; and
a high voltage output amplifier, coupled to the DC biasing component, configured to amplify the first DC biased voltage signal and the second DC biased voltage signal in a high voltage domain to provide an output signal in the high voltage domain.

22. The circuit of claim 15, wherein the DC bias generation component comprises:
diode connected transistors coupled to the DC biasing component.

23. A method for transforming voltage domains signals, comprising:
AC coupling an input signal from a low voltage domain;
splitting the low voltage signal into a first voltage signal and a second voltage signal;
DC biasing the first voltage signal with a first DC voltage to provide a first DC biased voltage signal and the second voltage signal with a second DC voltage to provide a second DC biased voltage signal; and
amplifying the first DC biased voltage signal and the second DC biased voltage signal in a high voltage domain, the high voltage domain having a greater maximum operating voltage than the low voltage domain.

24. The method of claim 15, further comprising:
amplifying the input signal in the low voltage domain.

* * * * *

UNITED STATES PATENT AND TRADEMARK OFFICE
CERTIFICATE OF CORRECTION

| | | |
|---|---|---|
| PATENT NO. | : 7,551,035 B2 | Page 1 of 1 |
| APPLICATION NO. | : 11/508966 | |
| DATED | : June 23, 2009 | |
| INVENTOR(S) | : Westra et al. | |

It is certified that error appears in the above-identified patent and that said Letters Patent is hereby corrected as shown below:

At Title page, section (75) Inventors, "Erol Arslan, Beveren (NL)" should be replaced by
--Erol Arslan, Beveren (BE)--.

Signed and Sealed this

Fourth Day of May, 2010

David J. Kappos
*Director of the United States Patent and Trademark Office*